United States Patent [19]

Setsune et al.

[11] 4,409,567
[45] Oct. 11, 1983

[54] SURFACE ACOUSTIC WAVE DEVICE

[75] Inventors: Kentaro Setsune, Sakai; Toshihide Tanaka, Ikoma, both of Japan

[73] Assignee: Matsushita Electric Industrial Co., Ltd., Kadoma, Japan

[21] Appl. No.: 220,254

[22] Filed: Dec. 24, 1980

[30] Foreign Application Priority Data

Dec. 28, 1979 [JP] Japan .............................. 54-171166

[51] Int. Cl.$^3$ ..................... H03H 9/145; H03H 9/42; H03H 9/64
[52] U.S. Cl. .................................. 333/151; 333/154; 333/194
[58] Field of Search .................. 333/193–196, 333/150–155; 310/313 R, 313 A, 313 B, 313 C, 313 D

[56] References Cited

U.S. PATENT DOCUMENTS

| 4,126,839 | 11/1978 | Yamanoi et al. | 333/195 X |
| 4,250,473 | 2/1981 | Gemba | 333/193 |
| 4,297,660 | 10/1981 | Ieki et al. | 333/151 X |

FOREIGN PATENT DOCUMENTS 54-98158  8/1979  Japan .................................. 333/154

Primary Examiner—Marvin Nussbaum
Attorney, Agent, or Firm—Cushman, Darby & Cushman

[57] ABSTRACT

A surface acoustic wave (SAW) device includes a SAW element disposed on a printed circuit. The printed circuit has an insulation substrate having input and output wiring conductors and input side and output side grounding conductors formed thereon. Interdigital transducers of the SAW element are connected to the input and output wiring conductors. The input side grounding conductors and the output side grounding conductors are disposed apart from each other with an isolation gap inbetween, thereby obtaining desirable filtering characteristics by suppressing undesirable coupling between input side and output side caused by a feed through electromagnetic wave.

4 Claims, 9 Drawing Figures

SURFACE ACOUSTIC WAVE DEVICE

BACKGROUND OF THE INVENTION

1. Field of the Invention:

The present invention relates to a structural improvement of a surface acoustic wave device capable of reducing undesirable coupling in the device caused by a feed through electromagnetic wave from the input side to the output side.

2. Description of the Prior Art:

Generally, an SAW (surface acoustic wave) element comprises an input piezoelectric transducer and an output piezoelectric transducer, both the transducers having a pair of comb-shaped electrodes which are coupled to each other, and formed on an SAW propagating substrate. The input transducer converts an RF (radio frequency) input electric signal to an SAW propagating on the SAW propagating substrate to the output transducer. And the output transducer converts the SAW propagating from the input transducer to an electric RF signal. The SAW propagating substrate is usually made of such material as a $LiNbO_3$, quartz or other piezoelectric crystalline material, or a glass having a thin vapor deposited layer of ZnO. The abovementioned SAW element is bonded on a printed circuit substrate, and is packed in a metal package, further being concealed by a cap.

Using a filtering characteristic or a signal delay characteristic, the abovementioned SAW element is used for various electronic device such as a filter device, a delay line, a resonator, etc. Usually, a piezoelectric transducer comprises a pair of comb-shaped electrodes (IDT) which are coupled to each other as the configuration that the hands of opposite electrodes are disposed alternately, and thereby the transducer can be made sufficiently small, comparable to a wavelength ($10^{-5}$ times a wavelength of the radio wave) of the SAW. Such IDT are formed by photo-etching.

A conventional SAW device comprises the abovementioned SAW element as shown in FIG. 1, wherein a SAW element 3 is bonded for example by an adhesive on a printed circuit substrate 1 having a grounding conductor layer 2 on a surface thereof.

An input piezoelectric transducer 4 and an output piezoelectric transducer 5 are disposed on the substrate 1, and also an input wiring conductor 6 and an output wiring conductor 7 are formed on the surface of the substrate 1. The input transducer 4 and the input conductor 6 are connected with each other by connecting means such as wire-bonding by using such a wire as Al wire, Au wire, etc. And the output transducer 5 and the output conductor 7 are connected with each other similarly.

Another conventional SAW device is shown in FIG. 2. In FIG. 2, a SAW 3' is diebonded on a conductive surface region of a can package 8. An input piezoelectric transducer 4' and a pair of input lead wires 10,10' are connected with each other by wire-bonding. And also an output piezoelectric transducer 5' and a pair of output lead wires 9,9' are connected with each other by wire-bonding. However, concerning an SAW element having transducers of abovementioned structure and disposition, a feed through electromagnetic wave from the input transducer to the output transducer increases as operating frequency becomes high. The feed through electromagnetic wave has a bad influence on various characteristics of the SAW element.

Let us analyze an operating characteristic of the SAW element using an equivalent circuit of a device including the SAW element mounted in a can package.

In FIG. 3, Zs is an electrical equivalent impedance of the input transducer, and Zs' is an electrical equivalent impedance of the output transducer. Es is an electromotive force induced in the output transducer. Rwa, Rwa', Rwb, and Rwb' are equivalent resistances of the wiring for the SAW element including the bonding wires. Lwa, Lwb, Lwa' and Lwb' are equivalent inductances of the wirings for the SAW element including the bonding wires. Ca, Cb, Ca', Cb', Cc, Cc', Cd and Cd' are equivalent stray capacities between the transducers and the grounding electrodes. Rei, Re and Reo are equivalent resistances of the grounding electrodes of the package. Ro is a grounding resistance between input and output both of which are outside of the package.

E is an input signal voltage considering a matching circuit outside of the package. Z is an impedance of a load connected to the output side of the device considering the matching circuit. In the equivalent circuit, the input transducer and the output transducer have a common grounding conductor, therefore an input signal current flows through the resistance Re, Reo and Ro. Accordingly, some voltage drop is induced across the resistance Reo responding to the input signal current. That is, an electromotive force caused by the feed through electromagnetic wave responding to the input signal is generated. Hence, when the resistance Re is infinitely large and none of stray capacities is in parallel with the resistance Re, the voltage drop in the resistance Reo will not occur. And when the resistance Re is infinitely large, and by means of a capacitive coupling caused by the stray capacities Cc, Cc' between the input transducer and the output grounding electrode and/or the stray capacities Cd, Cd' between the output transducer and the input grounding electrode, a considerable voltage drop in the resistance Reo occurs in the conventional structure. Hence it is desirable that the disposing between the input transducer and the output grounding as well as disposing between the output transducer and the input grounding electrode should be apart from each other.

SUMMARY OF THE INVENTION

The present invention has as an object to reduce undesirable coupling in a surface acoustic wave (SAW) device caused by the abovementioned feed through electromagnetic wave from the input side to the output side. The device comprises an SAW propagating substrate, a printed circuit substrate, an input transducer and an output transducer both of which are formed on the SAW propagating substrate and are bonded on the printed circuit substrate, therein the ground conductors of the input side and the output side are disposed apart with an isolation gap inbetween, thereby an electrical characteristic is improved.

DESCRIPTION OF THE PREFERRED EMBODIMENT

The present invention provides a surface acoustic wave (SAW) device which includes a SAW element having a SAW propagating substrate. An input piezoelectric transducer has a pair of comb-shaped electrodes which are coupled with each other and formed on the SAW propagating substrate for generating a surface acoustic wave on the propagating substrate in response to an input electric signal. An output piezoelectric transducer has a pair of comb-shaped electrodes which are coupled to each other and formed on the SAW propagating substrate for generating an output electric signal responsive to the surface acoustic wave on the SAW propagating substrate. A printed circuit is provided having an insulation substrate, with a wiring conductor formed on a surface of the insulation substrate as a signal input electrode and as a signal output electrode. That surface of the insulation substrate also has an input side grounding conductor and an output side grounding conductor, with the input side grounding conductor and the output side grounding conductor being isolated from each other by an isolation gap therebetween. A fixing means is provided for fixing the SAW element on the printed circuit along with connecting means for connecting the comb-shaped electrodes of the input piezoelectric transducer to the signal input electrode and to the input side grounding conductor. Connecting means are also provided for connecting the comb-shaped electrodes of the output piezoelectric transducer to the signal output electrode and to the output side grounding conductor.

Figure 4:
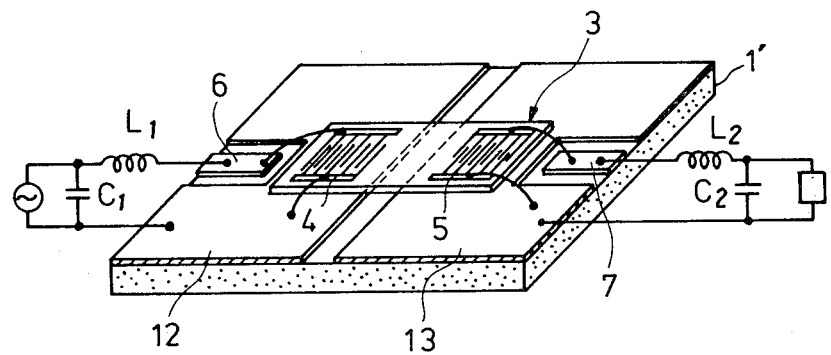
FIG. 4 is a perspective view of an example of the device embodying the present invention.

A schematic perspective view of an example device of the present invention is shown in FIG. 4. In FIG. 4, an input grounding electrode 12 and an output grounding electrode 13 are formed on an upper surface of a printed circuit substrate 1' separated from each other. An SAW element 3 is bonded on the printed circuit substrate 1' by an insulating bond in such a manner that an input piezoelectric transducer 4 is positioned on the input grounding electrode 12 and an output piezoelectric transducer 5 is positioned on the output grounding electrode 13. An inductor $L_1$ and a capacitor $C_1$ are disposed to an input side of the device for matching the input transducer 4 including an input wiring conductor 6, while an inductor $L_2$ and a capacitor $C_2$ are disposed to an output side of the device for matching the output transducer 5 including an output wiring conductor 7.

Figure 3:
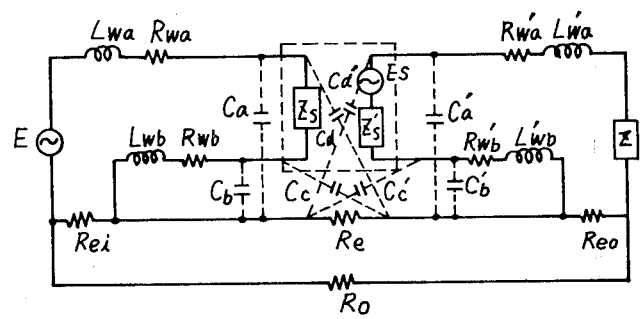
FIG. 3 is an equivalent circuit of the surface acoustic wave device together with a relevant circuit.

As mentioned above, the input grounding electrode 12 and the output grounding electrode 13 are formed as separated from each other, accordingly the resistance Re illustrated in FIG. 3 is an infinitely large value, and the capacities Cd, Cd', Cc and Cc' are small enough.

Therefore the coupling between the input side and the output side caused by the abovementioned feed through electromagnetic wave is reduced enough.

Figure 5:
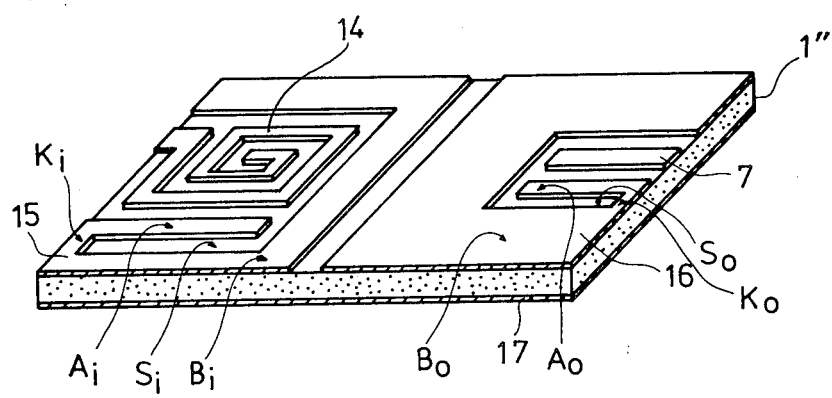
FIG. 5 is a perspective view of a printed circuit substrate in accordance with the present invention.
Figure 6:
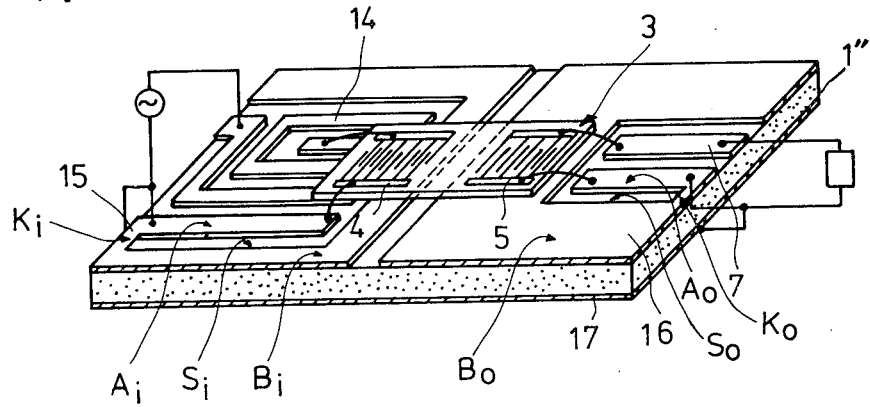
FIG. 6 is a perspective view of another example of the present invention having the printed circuit substrate shown in FIG. 5.

A perspective view of a printed circuit substrate of another type of the present invention is shown in FIG. 5. An SAW device of the present invention having the printed circuit substrate of FIG. 5 is shown in FIG. 6. In FIG. 5 and FIG. 6, an input grounding electrode 15 and an output grounding electrode 16 formed on an upper surface of a printed circuit substrate 1'' are disposed on the insulating substrate isolated from each other by an isolation gap. An input printed circuit conductor 14 is formed on the input side surface of the substrate 1'', and also an output printed circuit conductor 7 is formed on the output side surface of the substrate 1' as shown in the figures. A substrate grounding conductor 17 is formed on a lower surface of the substrate 1'', and the conductor 17 is connected to an external ground (not shown). The input wiring conductor 14 acts as an inductor when considering such a phenomenon that a coupling between the input side and the output side caused by the inductors $L_1$ and $L_2$ both illustrated in FIG. 4 easily occurs as the frequency becomes higher, and a required value of the matching inductor becomes smaller responding to an improvement of an operating frequency. An inductor 14 is formed by a rectangular whirlpool-shaped conductive layer at the input side of the upper surface of the substrate 1'' as shown in FIG. 5 and FIG. 6. On the printed circuit substrate 1'', the input grounding electrode 15 has a conductor part Ai to pass a signal current therethrough, and a conductor part Bi which does not pass a signal current, said conductor parts Ai and Bi being formed separately with a slit Si inbetween, and further the conductor parts Ai and Bi are connected by a connecting part Ki formed far from the input transducer 4. And similarly the output grounding electrode 16 has a conductor part Ao to pass a signal current therethrough, and a conductor part Bo which does not pass a signal current, said conductor parts Ao and Bo being formed separately with a slit So inbetween, and further the conductor parts Ao and Bo being connected by a connecting part Ko formed far from the output transducer 5. Taking the abovementioned structure, it was empirically confirmed that the undesirable coupling caused by the feed through electromagnetic wave was sufficiently reduced.

The abovementioned SAW device has a pair of transducers, that is, an input transducer and an output transducer, but other modification is possible as will be elucidated below.

Figure 7:
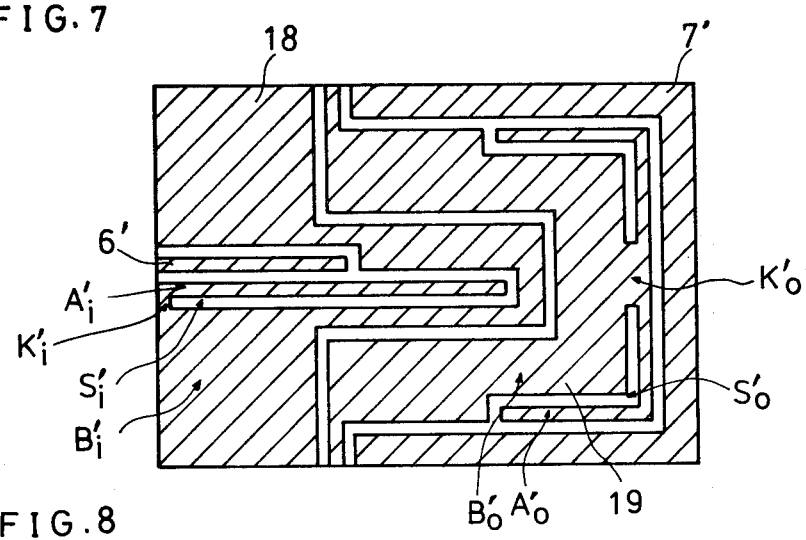
FIG. 7 is a plan view of another printed circuit substrate in accordance with the present invention.
Figure 8:
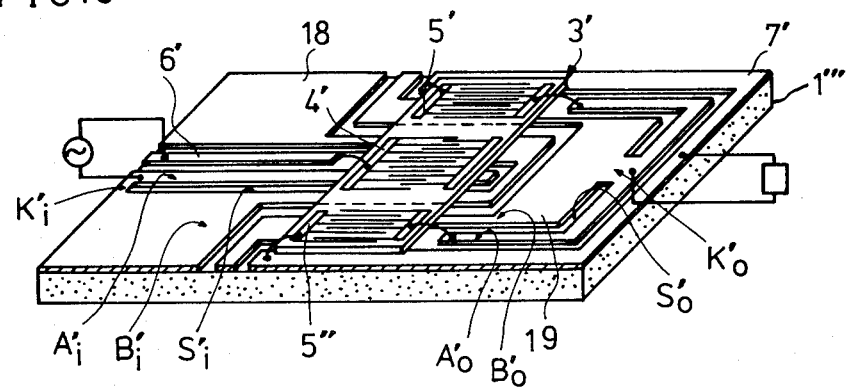
FIG. 8 is a perspective view of still another example of the present invention having the printed circuit substrate shown in FIG. 7.

A printed circuit substrate of another example of the present invention is shown in FIG. 7, and a SAW device of the present invention having the printed circuit substrate of FIG. 7 is shown in FIG. 8. Conductors formed on an isolation substrate is shown in FIG. 7 by hatching. In FIG. 8, a SAW element 3' has such three piezoelectric transducers that an input transducer 4', a first output transducer 5', and a second output transducer 5'' are provided together on a common insulation substrate.

In FIG. 7 and FIG. 8, an input grounding electrode 18 and an output grounding electrode 19 are formed as a surface conductive layers of the printed circuit substrate 1''' separated from each other with an isolation gap inbetween as shown in FIG. 7 and FIG. 8, and the isolation gap positions under a signal path of the SAW element 3'.

On the printed circuit substrate 1''', the input grounding electrode 18 has a conductor part Ai' to pass a signal current therethrough and a conductor part Bi' which does not pass a signal current, said conductor parts Ai' and Bi' being formed separately with a slit Si' inbetween, and further the conductor parts Ai' and Bi' are connected by a connecting part Ki' formed apart from the input transducer 4'. And similarly the output grounding electrode 19 has a conductor part Ao' to pass a signal current, and a conductor part Bo' said conductor parts Ao' and Bo' being formed separately with a slit So' inbetween, and further the conductor parts Ao' and Bo' are connected by a connecting part Ko' formed apart from the output transducers 5' and 5''. An input wiring conductor 6' is formed at an input side, and an output wiring conductor 7' is formed at an output side as shown in the figures. The input grounding electrode 18 is formed near the input transducer 4', and the output grounding conductor 19 is formed near the output transducers 5', 5''.

In the SAW device employing the abovementioned structure, undesirable coupling between the input side and the output side is sufficiently suppressed. The SAW device illustrated in FIG. 7 and FIG. 8 has a feature that a printed circuit can be formed to decrease the undesirable coupling caused by a stray capacity between the input and output printed circuit, by disposing the input and output grounding conductors of the printed circuit pattern isolated from each other.

Employing the abovementioned structure of the present invention, a matching circuit can be formed in a package of a device. Therefore a bulk of the device can be made small, and can be obtained with a superior reliability. And further, the higher the operating frequency is, the more desirable the effect of the present invention appears.

Figure 1:
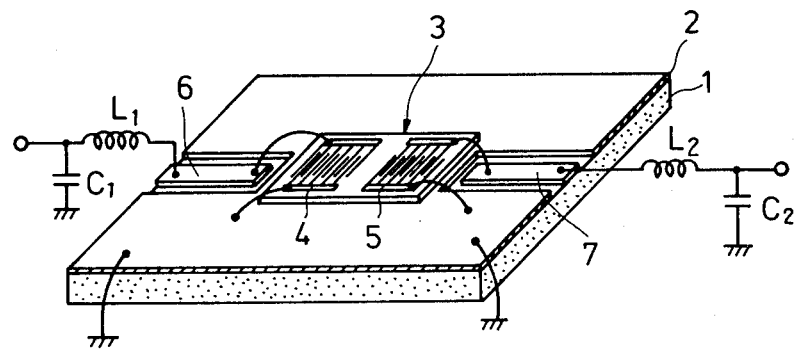
FIG. 1 is a perspective view of a conventional surface acoustic wave device.
Figure 2:
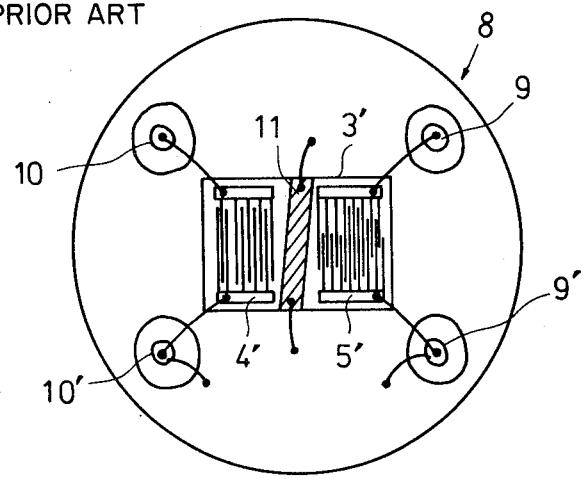
FIG. 2 is a plan view of another conventional surface acoustic wave device mounted on a can package.

For example, at the operating frequency of above 1 GHz, the direct coupling caused by the feed through electromagnetic wave from the input side to the output side can be suppressed to −20 dB in the conventional case mentioned for FIG. 1, and yet the direct coupling can be suppressed to −60 dB or more in the present case.

Figure 9:
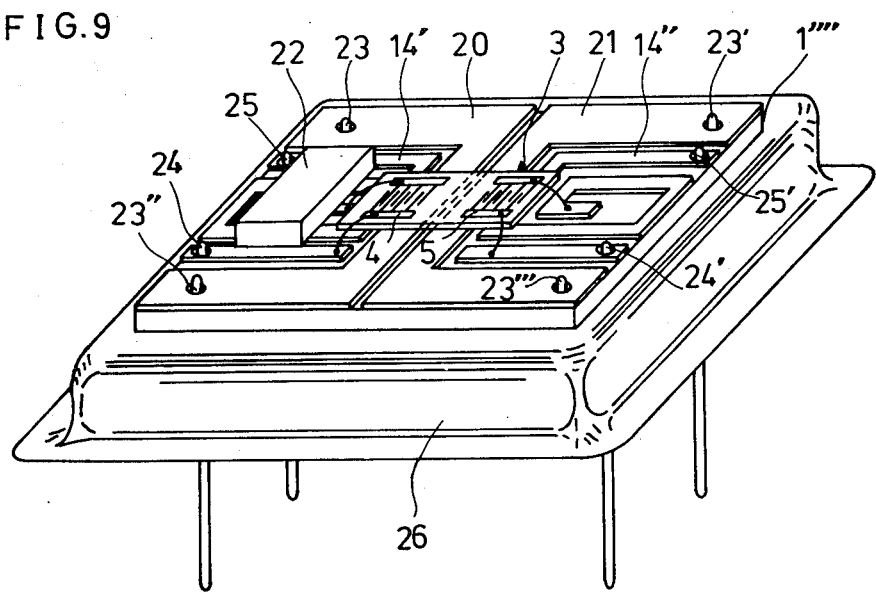
FIG. 9 is a perspective view of still another example embodying the present invention.

A SAW device of the present invention having a printed circuit substrate bonded on a metal can package is shown in FIG. 9. In FIG. 9, an input grounding conductor 20 and an output grounding conductor 21 are formed apart with an isolation gap inbetween. An input inductor 14' and an output inductor 14'' are respectively formed by a rectangular whirlpool-shaped conductive layer at an upper surface of a printed circuit substrate 1''''. The input inductor 14' is provided for an input matching of an input transducer 4, and the output inductor 14'' is provided for an output matching of an output transducer 5. A chip capacitor 22 is disposed on the input inductor 14'. The printed circuit substrate 1'''' is bonded on a metal can package. Contacts 23, 23', 23'', 23''' are provided penetrating the package for electrical connection to the grounding conductors 20, 21 and a package base 26 inbetween.

The contacts 23, 23', 23'', 23''' and the grounding conductors 20, 21 are fixed and electrically connected by a conductive bond or a solder at a portion that the contacts are set in a hole bored through the printed circuit substrate 1'''' respectively as shown in FIG. 9.

The printed circuit substrate 1'''' consists of such a material as a ceramics or glass fibre reinforced polyester, and when the substrate is airtightly concealed in a cap under a dry nitrogen atmosphere, a satisfactory reliability can be obtained. Generally, the can package has a conductivity, and therefore when a conductive portion of the can package is used as the grounding conductor the undesirable coupling caused by the feed through electromagnetic wave occurs. Especially in a high operating frequency range, the undesirable coupling occurs conspicuously. However, by using the printed circuit substrate of the present invention, the undesirable coupling can be suppressed enough and a bulk of an SAW device can be made very small, and further a high reliability can be obtained, because the matching elements can be formed and disposed in the can package. In addition, by taking such a structure that a cap is directly bonded on a printed circuit substrate, or that the substrate is molded by a resin, desirable characteristics thereof such as abovementioned can be also obtained.

As mentioned above, according to the present invention, an undesirable feed through electromagnetic wave due to electrical characteristics of the SAW element can be effectively suppressed, and further, the matching circuit can be made within the device suppressing the undesirable signal, therefore the bulk of the device can be made very small and a high reliability can be obtained, and also the SAW device of the present case can be easily coupled to another device.

What is claimed is:

1. A surface acoustic wave device comprising:
    (a) an SAW (surface acoustic wave) element having
        an SAW propagating substrate,
        an input piezoelectric transducer having a pair of comb-shaped electrodes which are coupled with each other and formed on said SAW propagating substrate and for generating an SAW on said SAW propagating substrate responding to an input electric signal,
        an output piezoelectric transducer having another pair of another comb-shaped electrodes which are coupled with each other and formed on said SAW propagating substrate and for generating an output electric signal responding to said SAW on said SAW propagating substrate,
    (b) a printed circuit having an insulation substrate,
        wiring conductors formed on a surface of said insulation substrate as a signal input electrode and as a signal output electrode, and at least one of said wiring conductors including one among an inductor and a capacitor,
        an input side grounding conductor formed on said surface and an output side grounding conductor formed on said surface, said input side grounding conductor and said output side grounding conductor being isolated from each other by an isolation gap inbetween,
    (c) fixing means for fixing said SAW element on said printed circuit,
    (d) connecting means for connecting said comb-shaped electrodes of said input piezoelectric transducer to said signal input electrode and to said input side grounding conductor, and
    (e) another connecting means for connecting said another comb-shaped electrodes of said output piezoelectric transducer to said signal output electrode and to said output side grounding conductor.

2. An SAW device in accordance with claim 1 wherein each of said input side and said output side grounding conductors has a first conductor part to pass a signal current therethrough and a second conductor part which does not pass a signal current, said first and said second conductor parts being formed separately from each other with a slit inbetween, and further said first and said second conductor parts being connected by a connecting part formed apart from said transducers, said connecting part being a terminal for connection of a signal for an external circuit.

3. An SAW device in accordance with claim 1 or 2 wherein said printed circuit, on which said SAW element is bonded, is disposed on a metal package.

4. An SAW device in accordance with claim 3 wherein said grounding electrodes on said insulation substrate are electrically connected to said metal package.

* * * * *